Figure 1:
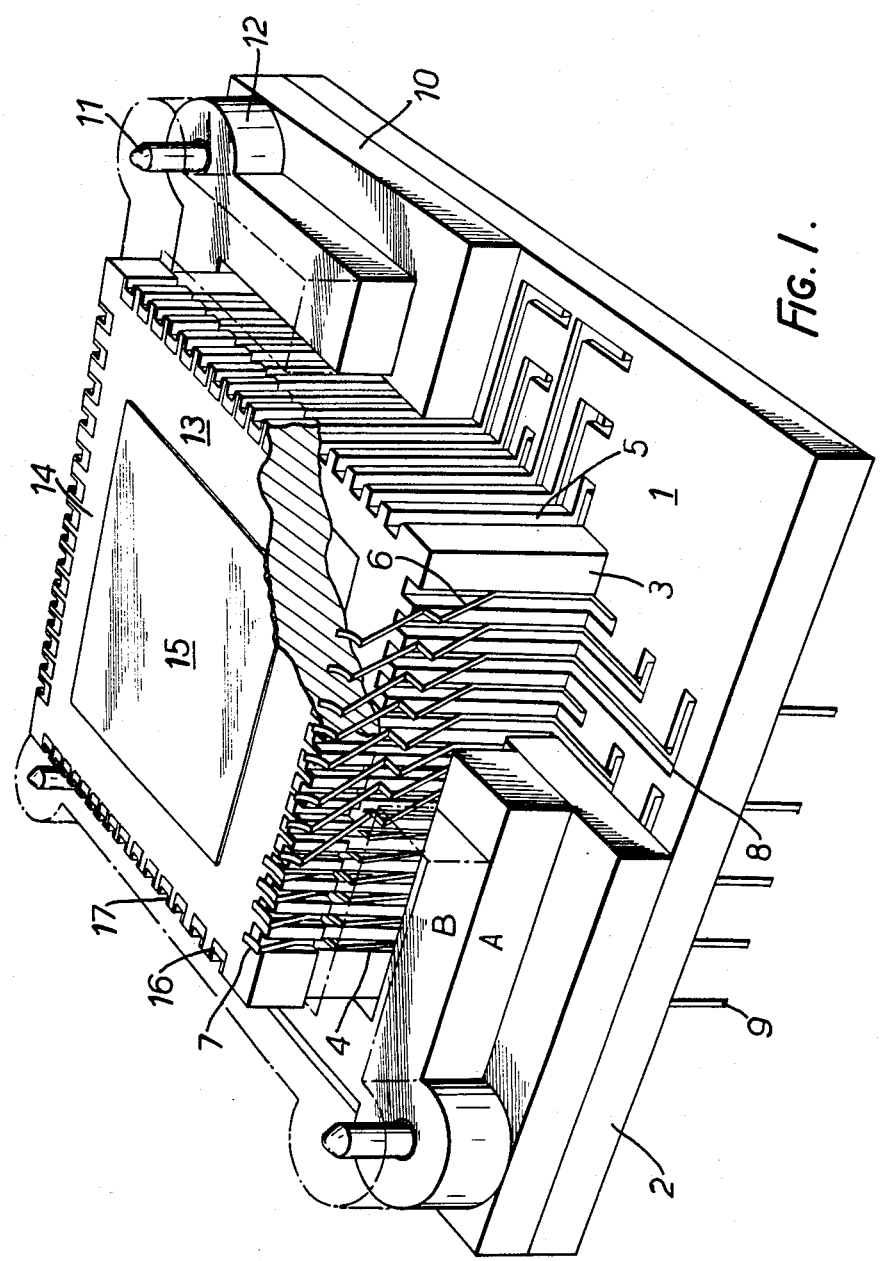

United States Patent [19]

Gudgeon

[11] Patent Number: 4,536,955
[45] Date of Patent: Aug. 27, 1985

[54] DEVICES FOR AND METHODS OF MOUNTING INTEGRATED CIRCUIT PACKAGES ON A PRINTED CIRCUIT BOARD

[75] Inventor: Bryan Gudgeon, Rossendale, England

[73] Assignee: International Computers Limited, London, England

[21] Appl. No.: 420,274

[22] Filed: Sep. 20, 1982

[30] Foreign Application Priority Data

Oct. 2, 1981 [GB] United Kingdom ............... 8129896

[51] Int. Cl.³ .................... H05K 3/34; B23P 19/00
[52] U.S. Cl. ........................... 29/840; 29/740; 339/17 CF
[58] Field of Search ............. 29/825, 739, 827, 740, 29/830, 729, 832, 840, 845, 846; 174/52 FP; 339/17 CF, 17 R; 357/74; 228/179

[56] References Cited

U.S. PATENT DOCUMENTS

| | | | |
|---|---|---|---|
| 3,588,618 | 6/1971 | Otte | 339/17 CF X |
| 3,753,211 | 8/1973 | Pauza et al. | 339/17 CF X |
| 3,905,098 | 9/1975 | Garretson et al. | 29/846 X |
| 4,155,615 | 5/1979 | Zimmerman, Jr. et al. | 29/827 X |
| 4,375,309 | 3/1983 | Griffin | 339/17 CF X |

Primary Examiner—Mark Rosenbaum
Assistant Examiner—Carl J. Arbes
Attorney, Agent, or Firm—Lee, Smith & Zickert

[57] ABSTRACT

The device incorporates a support member (1) for the circuit package (13); a plurality of contact elements (4) for connection with the conductive terminations mounted on the support member each of the contact elements being resiliently biassed away from its associated conductive terminations (16) and means (12) for selectively exerting pressure upon the contact elements so as to urge them into contact with their associated conductive terminations to facilitate soldering and after such soldering to facilitate the removal of the circuit package (13) if and when desired, by allowing the pressure to be removed so that on de-soldering the resilient loading on a contact (4) will cause it automatically to spring away from the associated conductive terminations.

4 Claims, 7 Drawing Figures

DEVICES FOR AND METHODS OF MOUNTING INTEGRATED CIRCUIT PACKAGES ON A PRINTED CIRCUIT BOARD

The present invention relates to devices for and methods of mounting integrated circuit packages on a printed circuit board.

Integrated circuit packages usually have a large number of closely spaced terminations which require to be connected to conductors on the printed circuit board. If conventional soldered joints are employed, replacement of a package, which may be necessitated, for example, by the package becoming defective, is a difficult and lengthy operation due to the large number of disconnections to be made simultaneously. Such a soldering replacement procedure could damage the printed circuit board and package assembly rendering it unusable.

It has previously been proposed to provide intermediate support or connector devices carrying spring contacts which engage the terminations of the package and are connected to contact pins which are in turn soldered to the printed circuit board. Thus, a package may be easily replaced in the manner of a jack connector. However, a disadvantage with the introduction of solderless connections is that the overall reliability is impaired as solderless connections are generally less reliable than soldered connections.

According to a first aspect of the invention there is provided a method of mounting an integrated circuit package on a printed circuit board, the integrated circuit package having a plurality of conductive terminations for connection to conductors on the printed circuit board, by using a support member having a plurality of contact means arranged so as to be postionable one adjacent each conductive termination, with each of the contacts being so resiliently loaded that in a first relative positioning between the integrated circuit package conductive terminations and the contact means the contact means do not electrically connect with the conductive terminations, and a second relative positioning therebetween electrical contact is produced and maintained between the conductive terminations and the contact means, each said contact means being connected with a specified one of the conductors on the printed circuit board, the method of including the steps of providing means for exerting pressure upon the contact means to produce said electrical connection; electrically connecting each of the contact means to its specified conductor of the printed circuit board; actuating the means for exerting pressure to move the contact means against the resiliency thereof into electrical contact with the conductive terminations; and soldering each contact means to the associated conductive termination, the method being further such that the electrical contact producing pressure is maintained upon the contacts following the soldering operation, and that whenever it is required to unsolder the contacts the pressure is relieved prior to unsoldering so that following an unsoldering operation the resiliency of the contact means automatically causes each unsoldered contact means to spring away from the associated conductive termination as it is unsoldered.

According to a second aspect there is provided a device for mounting an integrated circuit package on a printed circuit board, the integrated circuit package having a plurality of conductive terminations for connection to conductors on the printed circuit board, including, a support member for supporting the integrated circuit package;

a plurality of contact elements for electrical connection with the conductive terminations mounted on the support member, each of the contact elements being positioned so as to be able to co-operate with an associated conductive termination of the integrated circuit package, the contact elements being resiliently biassed in a direction away from contact with its associated terminations; and means for selectively exerting pressure upon the contact elements so as to urge them into contact with their associated conductive terminations to facilitate soldering of the contact elements to the conductive terminations and, after soldering, to relieve strain on the soldered joints, the pressure exerting means being movable away from the contact elements so that, on melting the soldered joints, the contact elements are able to spring away from the conductive terminations to thereby facilitate removal of the integrated circuit package from the printed circuit board.

The pressure member may be mounted on the support member for sliding motion or alternatively, may be a removable clip-on member.

Mechanical means may be employed for operation of the pressure member.

Figure 2:
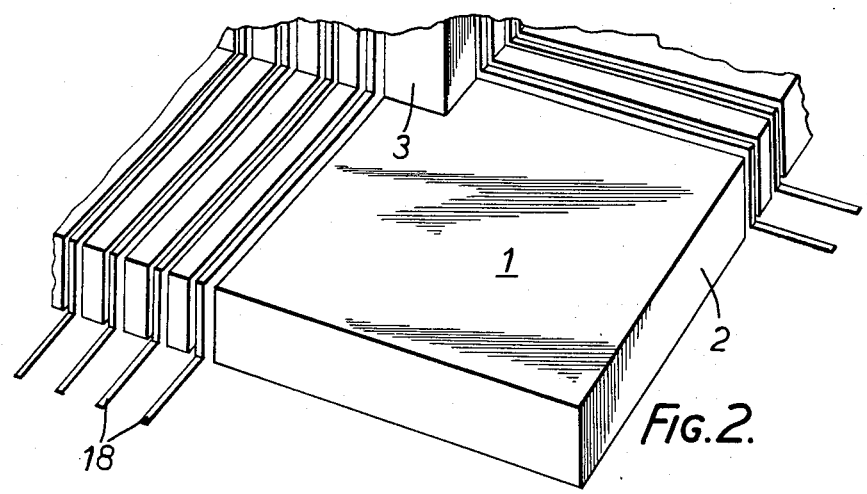

A device for and a method of mounting an integrated circuit package on a printed circuit board embodying the present invention will now be described, by way of example, with reference to the accompanying drawing, in which, FIG. 1 illustrates a perspective view of the device, part of which is cut-away to show its operation, FIG. 2 is a scrap view showing a modified form of the device, FIGS. 3 (a) to (e) show further embodiments of the invention.

Referring now to FIG. 1 of the drawings, an integrated circuit support assembly 1 comprises a contact element frame 2 having a raised portion 3. Contact elements 4, which are of spring material such as, for example, phosphor bronze, are located in slots 5 in the raised portion 3 of the support 1. The contact elements 4 are shaped to provide a ramp portion 6 extending outwardly from the slots 5 and an upper portion with a turned over end 7. (Some of the contact elements 4 have been omitted from the drawing for the sake of clarity.) It will be noted that the contact elements 4 are sprung outwardly so that the turned over ends 7 stand clear of the top surface of the raised portion 3. The opposite ends of the contact elements 4 extend within recesses 8 and through the frame 2 to terminate in pins 9 for insertion into holes in the conductors of a printed circuit board. The pins 9, when soldered to the conductors provide connections thereto and also serve to support the assembly 1 on the printed circuit board.

A contact element retaining frame 10 carrying dowels 11, one at each corner, is secured to the support assembly 1. The frame 10 may be of moulded plastics material, for example, with the dowels 11 integrally formed. A pressure member, which is in the form of a frame 12 and may also be moulded from plastics material, has a hole at each of its corners for engagement with the dowels 11. The dowels 11 are a sliding fit within the holes to allow the pressure frame 12 to be moved upwards and downwards on the dowels.

An integrated circuit package 13 comprises a leadless chip carrier 14 and an integrated circuit chip 15 mounted inside. Connections (not shown) from the chip 15 are brought out to contact pads 16 situated around the periphery of the chip carrier 14. The pitch of such contact pads may be as small as 0.020 in. (0.5 mm). Slots 17 in the edges of the chip carrier 14 extend through the contact pads 16 and are spaced at the same pitch as the slots 5 in the support assembly 1. Thus, the slots 5, the contact pads 16 and the slots 17 are all spaced at the same pitch.

In operation the pressure frame 12 is placed in its lowermost position, as indicated by A, in which it is below the ramps 6 of the contact elements 4. In this position the contact elements 4 are free to spring outwardly so that their ends 7 are clear of the top of the raised portion 3 of the assembly 1 as previously mentioned. The chip carrier 14 is placed on the top surface of the raised portion 3 with the slots 17 of the chip carrier and the slots 5 of the support assembly 1 in alignment. The pressure frame 12 is then raised as indicated by the dotted outline of the frame at B, engaging the ramp portions 6 of the contact elements 4 during its upward movement to urge the upper ends of the contact elements 4 into the slots 5 and 17 to cause the ends 7 to engage the contact pads 16 on the chip carrier 14. The ends 17 of the contact elements 4 can now be soldered to the contact pads 16. The pressure frame 12 is left in the raised position after soldering and it then serves to relieve any strain on the soldered joints which might be imposed by the spring contact elements 4. Finally, the assembly may be mounted on the printed circuit board.

If it subsequently becomes necessary to remove the chip carrier 14 due to, for example, a fault in the chip 15, the pressure frame 12 is moved back into its lowermost position and, upon application of heat to melt the soldered joint, the contact elements 4 spring away from the contact pads 16 to allow easy removal of the chip carrier. Heat may be applied to the soldered joints either collectively or, individually by, for example, a soldering iron.

It will therefore be seen that the present invention provides the advantages of the reliability of soldered connections with virtually the same ease and speed of disconnection as is provided with connections made by pressure alone.

A further advantage of the present invention is that functional testing can be carried out prior to soldering the contact elements to the contact pads of the chip carrier. For example, after the pressure frame has been raised to engage the contact elements with the contact pads, the chip support assembly can be mounted on the printed circuit board and connected thereto. Thus, testing of the whole circuit board assembly can be carried out at this stage and any faulty parts removed before the soldering operation.

In a modified form of the device illustrated in FIG. 2, the contact elements 4, instead of extending from the underside of the chip support assembly 1 to form contact pins 9, extend from the sides of the support assembly to provide leads 18 which may be soldered onto the surface of the conductors carried on a printed circuit board.

Figure 3A:
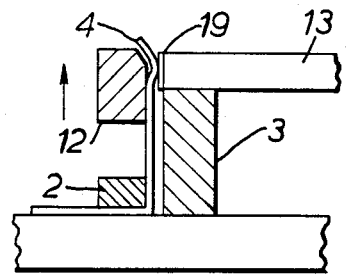
Figure 3B:
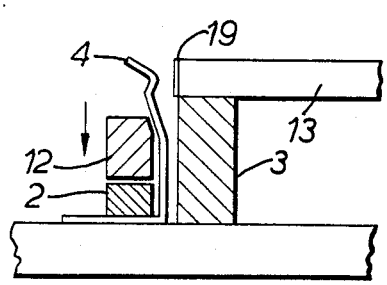

FIGS. 3(a) and 3(b) illustrate another embodiment of the invention in which contact pads 19 are situated on the sides of the chip carrier 14 instead of on its upper surface. The sliding pressure frame 12 operates in the same manner as previously described to urge the contact elements 4 into contact with the side mounted contact pads 19.

Figure 3C:
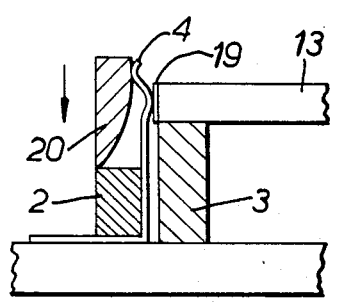
Figure 3D:
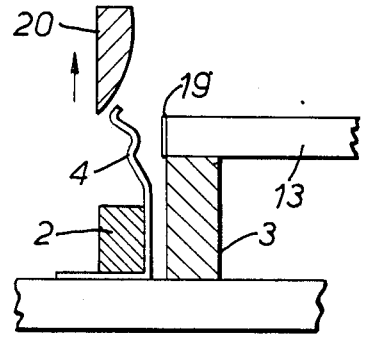
Figure 3E:
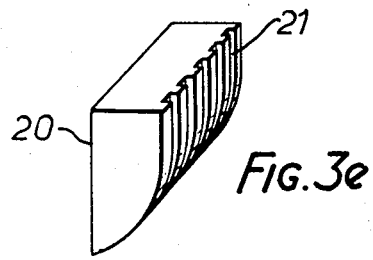

FIGS. 3(c) (d) and (3e) illustrate yet another embodiment of the invention in which a different form of pressure frame is employed. The alternative pressure frame 20 is a removable clip-on frame which is lowered on to the assembly 1. The frame 20 is shaped as shown with a curved profile which engages the contact springs and, as the frame is lowered urges them into contact with the contact pads 19. Slots 21 may be provided in the frame 20 as shown in FIG. 3(e) to assist in maintaining the contact elements in spaced alignment. The frame 20 is left in the lowered position to provide strain relief for the soldered joints in the same manner as in the previous embodiment.

It will be realised that various modifications can be made to the structures as described without departing from the basic concept of the invention. For example, it may be of advantage to provide mechanical means to raise or lower the pressure frame. Such mechanical means could include, for example, a lever or cam operated device.

What I claim is:

1. A method of mounting an integrated circuit package on a printed circuit board, the integrated circuit package having a plurality of conductive terminations for connection to conductors on the printed circuit board, by using a support member having a plurality of contact means arranged so as to be postionable one adjacent each conductive termination, with each of the contacts being so resiliently loaded that in a first relative positioning between the integrated circuit package conductive terminations and the contact means the contact means do not electrically connect with the conductive terminations, and a second relative positioning therebetween electrical contact is produced and maintained between the conductive terminations and the contact means, each said contact means being connected with a specified one of the conductors on the printed circuit board, the method of including the steps of providing means for exerting pressure upon the contact means to produce said electrical connection; electrically connecting each of the contact means to its specified conductor of the printed circuit board; actuating the means for exerting pressure to move the contact means against the resiliency thereof into electrical contact with the conductive terminations; and soldering each contact means to the associated conductive termination, the method being further such that the electrical contact producing pressure is maintained upon the contacts following the soldering operation, and that whenever it is required to unsolder the contacts the pressure is relieved prior to unsoldering so that following an unsoldering operation the resiliency of the contact means automatically causes each unsoldered contact means to spring away from the associated conductive termination as it is unsoldered.

2. A method as claimed in claim 1, in which the means for exerting pressure upon the contact means is mounted for slidable motion between the pressure exerting position and the pressure relieving position.

3. A method as claimed in claim 1 or 2, and including the steps of functionally testing the integrated circuit package prior to the soldering operation, by causing the pressure exerting means to exert pressure on the resiliently loaded contacts, applying the requisite testing procedures to the package, and in the event of malfunction to operate the pressure exerting means to release the electrical contacts to allow removal of the package, and in the event of acceptable operation to effect the soldering operation.

4. A device for electrically interconnecting a plurality of conductive terminations on an integrated circuit package of corresponding terminations of conductors on a printed circuit board, the device including a support unit presenting a first surface or region for co-operating with the printed circuit board on mounting the support to the board, and a second surface or region for receiving the package, a first group of electrically conductive contact members having first portions mounted on the support and having second portions for connection with the terminations of the package on positioning the latter on the second surface or region of the support; a second group of electrically conductive second contact members electrically connected to the first group of contact members and having portions for connection with corresponding ones of the terminations of the conductors of the printed circuit board, each of said second portions of the first contact members being resiliently biased in a direction away from electrical contact with the associated terminations of the package, and a pressure producing means, movably mounted upon the support and arranged for co-operation with the second portions of the first contact members, the pressure producing means having a first position in which the second portions of the first contact members are resiliently loaded into electrical contact with associated ones of the package terminations to enable the physically co-operating second portions of the first group of contact members and package terminations to be soldered together, said loading being maintained on the first portions of the first group of contact members whilst the pressure producing means is in the first position thereby to stress relieve the soldered connections, the pressure producing means having a second position in which the loading on the second portions of the first group of contact members is released so that upon breaking any of the soldered connections, the unsoldered second portions of the first group of contact members automatically move out of electrical connection with the package terminations.

* * * * *